United States Patent
Petefish et al.

[11] Patent Number: 5,853,517
[45] Date of Patent: Dec. 29, 1998

[54] METHOD FOR COINING SOLDER BALLS ON AN ELECTRICAL CIRCUIT PACKAGE

[75] Inventors: William George Petefish; Boydd Piper; Thomas E. Walker, all of Eau Claire, Wis.

[73] Assignee: W. L. Gore & Associates, Inc., Newark, Del.

[21] Appl. No.: 745,400

[22] Filed: Nov. 8, 1996

[51] Int. Cl.$^6$ .................................................. H05K 03/00
[52] U.S. Cl. ............................................ 156/196; 29/882
[58] Field of Search ................................... 156/150, 151, 156/196; 228/180.1; 29/882

[56] References Cited

U.S. PATENT DOCUMENTS

| | | | |
|---|---|---|---|
| 3,953,566 | 4/1976 | Gore | 264/288 |
| 4,162,572 | 7/1979 | Rozmus | 29/882 X |
| 4,482,516 | 11/1984 | Bowman et al. | 264/127 |
| 4,705,762 | 11/1987 | Ota et al. | 501/87 |
| 4,985,296 | 1/1991 | Mortimer, Jr. | 428/220 |
| 5,279,711 | 1/1994 | Frankeny et al. | 174/263 |

FOREIGN PATENT DOCUMENTS

| | | |
|---|---|---|
| 0 011 013 | 5/1980 | European Pat. Off. . |
| 0 561 620 | 9/1993 | European Pat. Off. . |
| 09153513 | 6/1997 | Japan . |

OTHER PUBLICATIONS

"Low Melt Solder Preform for Chip Attach", Research Disclosure, No. 331, Nov. 1, 1991, p. 872.

"Solder–Height Variation Reduction by Calendaring", IBM Technical Disclosure Billetin, vol. 33., No. 1B, Jun. 1, 1990, pp. 77–78.

*Primary Examiner*—Francis J. Lorin
*Attorney, Agent, or Firm*—Victor M. Genco, Jr.

[57] ABSTRACT

A method and apparatus are provided for coining solder balls on an organic electrical circuit package. Generally, this method includes placing a slug on one or more of the solder balls; and applying sufficient pressure for a sufficient period of time on the slug to flatten the surface of the solder balls so as to form planar solder coins. The apparatus includes a press; a ram attached to the press; a platform for receiving the package and a slug placed upon the solder balls.

8 Claims, 5 Drawing Sheets

METHOD FOR COINING SOLDER BALLS ON AN ELECTRICAL CIRCUIT PACKAGE

FIELD OF THE INVENTION

The present invention generally relates to a method and apparatus for coining solder balls, and more particularly, to coining solder balls on an electrical circuit package for flip chip applications.

BACKGROUND OF THE INVENTION

Single and multiple silicon chip packages, or semiconductor chip packages, are used to provide electrical connection between semiconductor chips and other electronic components in an electronic circuit, such as die-to-package or chip-to-board interconnects. These single and multiple chip packages serve as a substrate to securely anchor electronic components and as a pathway for electrical signals.

Newer technologies, such as area array attachment techniques, are driving engineers to design chip packages that more closely match the coefficient of thermal expansion (CTE) of silicon, or otherwise ensure, the reliability of such packages through thermal cycling. Embracing, and in some cases over-riding, these trends is a constant drive in the electronics industry to improve performance and simultaneously reduce cost.

Most conventional single and multiple chip packages are typically constructed from thick, mechanically robust dielectric materials, such as ceramics (e.g., alumina, aluminum nitride, beryllium oxide, cordierite, and mullite) and reinforced organic laminates (e.g., epoxies with woven glass, polyimides with woven glass, and cyanate ester with woven glass). In some cases, materials are combined to produce certain improved properties, for example, a package may have a ceramic base with one or several thin films of polyimides or benzocyclobutane (BCB) disposed thereupon.

The most common single or multiple chip electronic packages are made from injection molded plastics with metal lead frames. Sometimes, these packages include laminated interconnect structures made from materials such as FR-4 and BT resins. Recently, advances have been made with these laminated structures to somewhat increase density and performance, as in the case of laminated ball grid array packages. Such packages employing FR-4 and BT resins have a number of advantages, such as lower cost, wide availability, lower dielectric constant, lower resistivity conduction paths, and lighter weight. Unfortunately, these packages suffer from a multiplicity of shortcomings which detract from their usefulness. These shortcomings include low wiring densities, low via densities, high via capacitance, poor CTE match to silicon, non-flatness, large package size, poor thermal stability, poor thermal conduction, and thick packages. Some of these deficiencies have been addressed with the use of thin film polyimides and/or BCBs on ceramics. These materials have high via and wiring densities, small size, and lower dielectric constant. Despite these advantages, these materials still suffer from many shortcomings including high cost, highly resistive conduction paths, lower characteristic impedance, and processing problems leading to limited manufacturing sources and long lead times.

In an attempt to address the industry need for superior price-performance in single and multiple chip packages, packaging technologies have been developed which are based on thin dielectrics that are not reinforced with glass fibers or other mechanical aids. Examples of these thin dielectrics include thin polyimides and polytetrafluoroethylene ("PTFE") based dielectrics, such as ceramic filled PTFE or cyanate ester impregnated porous PTFE. Compared with the conventional materials described hereinabove, these packaging technologies yield superior via and wiring density, extremely low dielectric constants, lower via capacitance, lower resistance, smaller package size, thinner packages, CTE matching over a wide range, lower package weight, greater thermal stability, and higher reliability than competing technologies. In some cases, thin dielectrics are used that contain reinforcing materials such as woven glass. Notwithstanding such advantages, these technologies are impaired by very thin, fragile packages. For example, while typical ceramic packaging has a modulus of elasticity values of $40$–$50 \times 10^6$ psi, a typical modulus for a ceramic filled PTFE based package is only about 100,000 psi. Due to these constraints, packaging made from this material is very difficult to handle and assemble. Mechanical stiffeners are commonly added to thin packages made with these materials to give them the needed mechanical robustness.

Conventionally, semiconductor chips contain solder balls having lead contents of 95% and greater with the remaining material being tin. Due to the high lead content, the melting point of these solder balls are in excess of 300° C. However, during the process step that requires reflowing of the solder in order to connect the chip to the package, the chips can not be subjected to these high temperatures without damaging their components. And thus, the high lead content solder balls do not melt. Accordingly, there is a need in the industry to still use these high lead content solder balls and connect them to chip packages.

Moreover, the chip packages also contain solder balls but these solder balls are typically a eutectic solder with a lower melting point. Therefore, during the process step of reflowing the solder balls of the chip package, the attachment of the solder balls of the chip to the solder balls of the package may result in a high defect rate because the chip's solder balls may not properly rest on the corresponding solder balls of the package due to the small possible area of contact between the two corresponding solder balls.

The foregoing illustrates limitations that exist in present high density chip package development. Thus, it is apparent that it would be advantageous to provide a method and apparatus for increasing the possible area of contact between the corresponding solder balls and thus, to improve connectivity and reduce the defect rate.

SUMMARY OF THE INVENTION

The present invention provides a method and apparatus for coining solder on chip packages to improve the connections with chips attached to the package. In one aspect of the present invention, the method comprises the following steps:

placing a slug on one or more of the solder balls; and
applying sufficient pressure for a sufficient period of time to the slug to flatten the surface of the solder balls so as to form planar solder coins.

In another aspect of the present invention, the apparatus for coining solder balls on an electrical circuit package comprises: a solder coining press; a ram attached to the press; a platform for receiving the package; and a slug placed on top of the solder balls.

It is, therefore, a purpose of the present invention to describe a method and apparatus whereby solder coining may be formed on an electrical circuit package without damage to the chip package while forming a planar surface of the solder. And thus, avoiding the shortcomings in the present high density chip package development. It is a further purpose of the present invention to provide improved connectivity because the coined solder balls have a larger possible area of contact and thus, improves the potential for the coined solder balls to properly rest on the conductive pads of the chip during the reflow process.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

The present invention may be employed in any application where planar coined solder balls are required to be produced on an electrical circuit package with solder balls.

The following describes one embodiment of the present invention where a complete chip package is first produced having solder balls. Any type of solder that provides good electrical and mechanical attachment can be used. An example of the type of solder that can be used is eutectic solder having a ratio of tin to lead of approximately 63/37% and having a melting point of between about 180–185 degrees C. The solder or solder paste is reflowed and cleaned to form solder balls.

Subsequently, the coined solder balls are produced according to the following method. In one embodiment of the present invention involving a panel having multiple chip packages where the solder balls of each chip package are in a cavity, a slug is placed on top of the solder balls in the cavity in the chip package. The slug is thicker than the cavity so that the slug extends above the top surface of the cavity. In another embodiment of the present invention, which does not involve a substrate containing a cavity, no slug is necessary.

Figure 1:
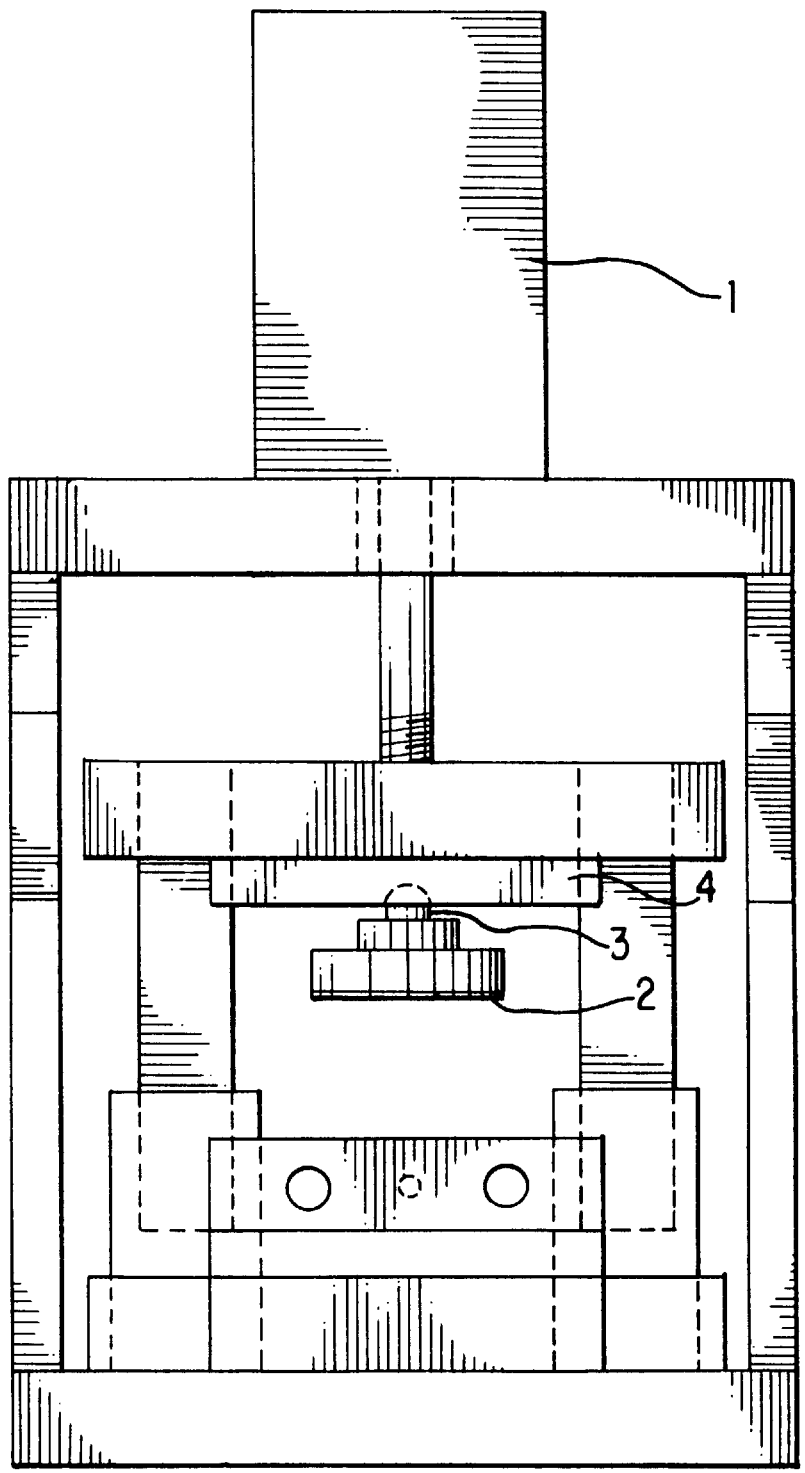
FIG. 1 illustrates a front view of the apparatus for solder coining according to the present invention.
Figure 2:
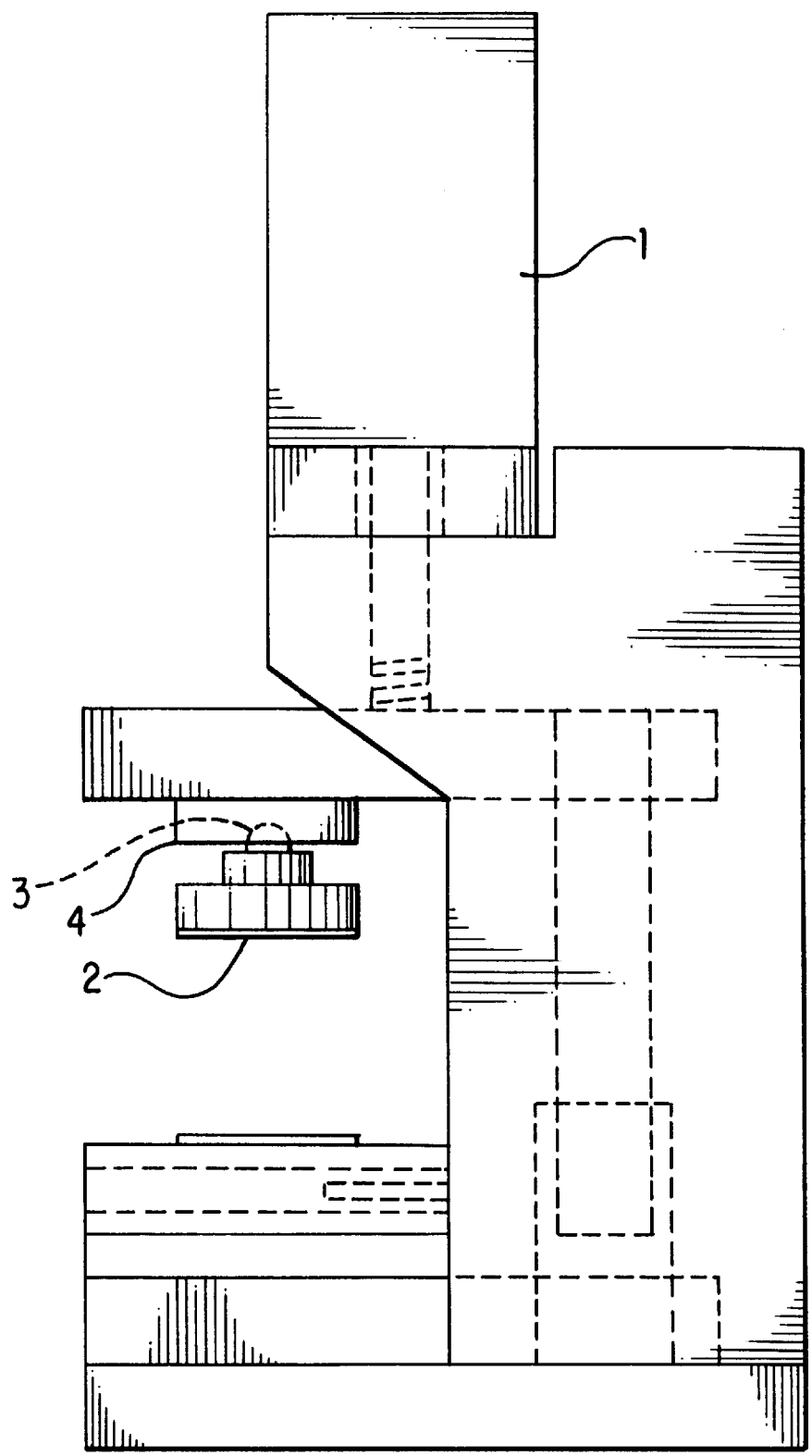
FIG. 2 illustrates a side view of the apparatus according to the present invention.

As illustrated by FIGS. 1 and 2, the solder coin press of the present invention comprises a ram 1 with a material 2 that provides uniform distribution to all of the solder balls across the chip package on the part of the ram facing the package. The ram is a standard ram sized to accomplish the following. In one embodiment, silicone rubber 2 is employed having approximately 0.03 inches thickness.

In addition, in one embodiment, the solder coining press is self planarizing. This is achieved by providing a ball 3 and socket type 4 of arrangement in the top portion. Thus, even if the top plate swivels, the plate levels itself so that it will push uniformly against the bottom piece, i.e., the package.

Figure 3:
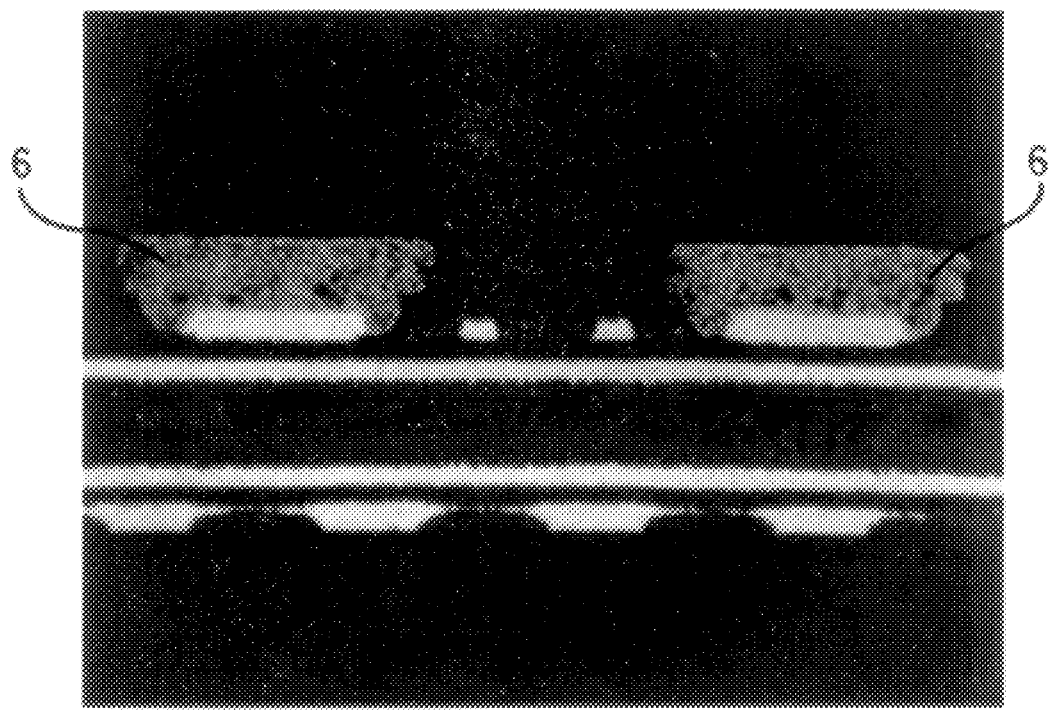
FIG. 3 illustrates two coined balls made according to the present invention.
Figure 4:
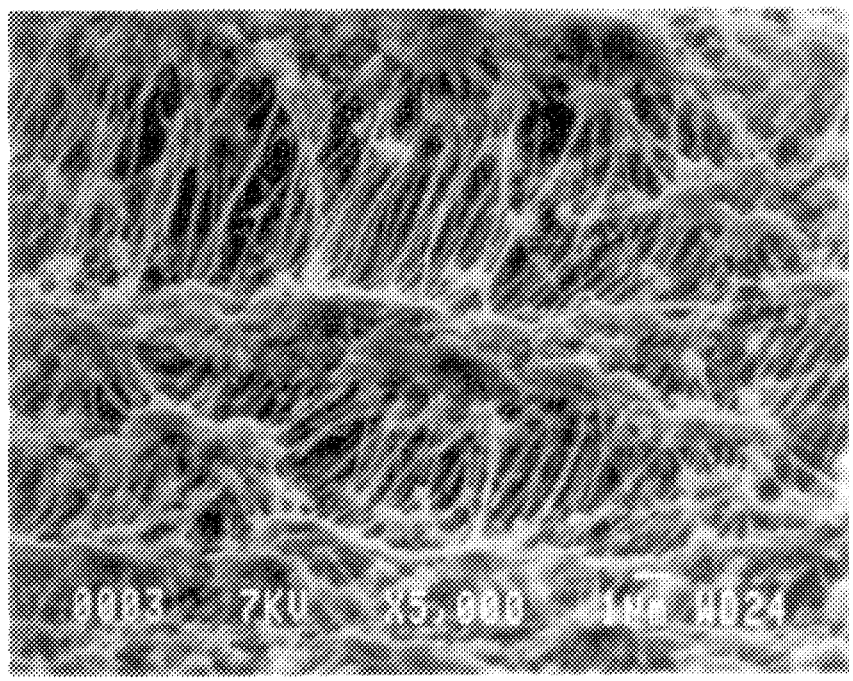
FIG. 4 is an electron microscope photograph of expanded polytetrafluoroethylene ("PTFE") showing the node fibril structure.
Figure 5:
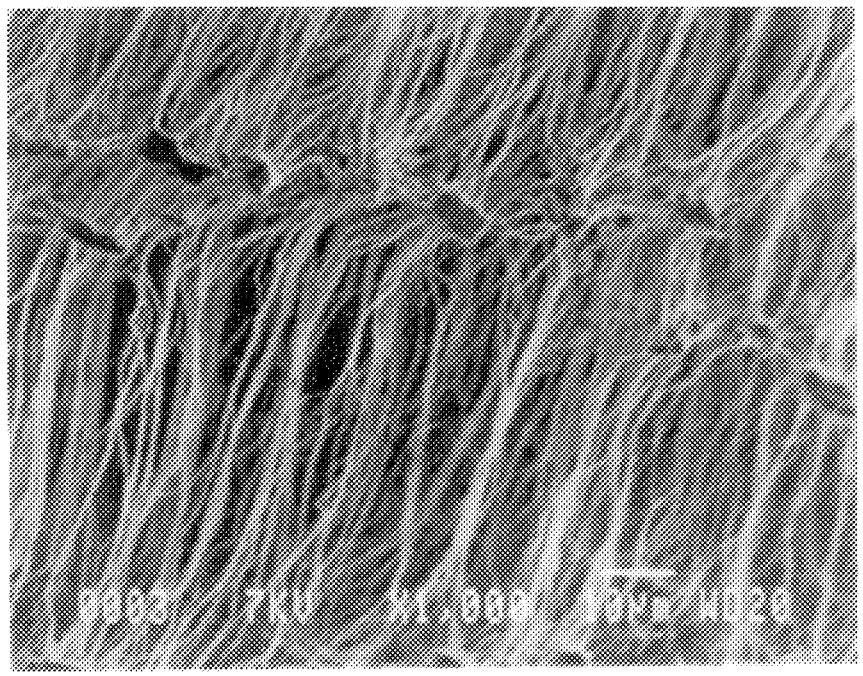
FIG. 5 is an electron microscope photograph of an expanded PTFE web showing the node fibril structure.

In those applications requiring a slug, the slug is placed on the solder balls within a cavity. In those applications not requiring a slug, a metal interface is placed on the solder balls. For purposes of the present invention, the term "slug" includes a metal interface. The ram 1 having the silicone rubber face 2 is pressed onto the slug. The amount of time that pressure is applied is determined by the type of solder employed and the amount of pressure applied is dependent on the area of the part to be coined. FIG. 3 shows a finished coined solder ball 6 made in accordance with the teachings of the present invention. In a further embodiment, heat may be applied during the coining process. The device that may be used to provide heat to the package can be located below the package. The purpose is to reduce the overall pressure required.

In another embodiment of the present invention, solder or paste is first applied to the chip substrate. Then, a chip package is made according to the following method. A metal base plate is placed on the bottom half of the vacuum frame. An interface material is placed atop the base plate. The base plate is typically a solid metal plate where the alignment frame and substrates are placed on. The interface material serves to prevent the contact of the surfaces of the components to the metal of base or frame. The interface material is a material that typically has the following properties: thin; non-stick; a sufficiently low modulus so as not to damage the chip package; and the ability to withstand processing temperatures required to cure the adhesive. Examples of suitable interface material include thin sheets of polytetrafluoroethylene ("PTFE"), skived PTFE, polyimide and Kapton™ tape. In one embodiment, the interface material is skived PTFE supplied by DeWall Industries, Saundertown, R.I.

The alignment frame is placed atop the interface material. The corners of the frame are taped to the base of the vacuum frame using Kapton™ tape so as to maintain flatness of the alignment frame. The alignment frame has window openings that are sized to insure that alignment of the finished components meets or exceeds customer specifications. In one embodiment, the openings are sized 0.003" to 0.005" larger than the finished package size. The alignment frame allows parts that contain no internal alignment mechanism, such as tooling holes, to be aligned and bonded. The alignment frame material should have a coefficient of thermal expansion that is equal to or less than the components being bonded, for example, solid copper. The alignment frame's thickness should also be equal to or less than the total thickness of the components being bonded sufficient to provide alignment of the top component and allow pressure to be applied to the entire package's surface area.

The substrates or substrate packages are placed within the openings of the alignment frame with the attach side facing up. Suitable substrate materials include multi-chip or single chip circuits comprised of laminated copper (power/ground and signal layers) interspersed with dielectric material. In one embodiment, thin organic material chip substrates are cut from a panel to form individual substrates. Any suitable dielectric material can be used in the present invention, such as, but not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be PTFE, ePTFE or copolymers or blends. Suitable fluoropolymers include, but are not limited to, polytetrafluoroethylene or expanded polytetrafluoroethylene, with or without an adhesive filler mixture.

Preferred materials include Speedboard® bond plies available from W. L. Gore and Associates, Inc., such as, Speedboard® C which is a prepreg of non-woven material containing a cyanate ester resin in a polytetrafluoroethylene matrix. Speedboard® C has a dielectric constant, Dk of is 2.6–2.7 at 1 MHz–10 GHz, a loss tangent of 0.004 at 1 MHz–10 GHz, a dielectric strength greater than 1000 V/mil, a glass transition ($T_g$) of 220° C., a resin content of 66–68 wt. % and is available in a variety of thicknesses. Also Speedboard® N prepregs, which is a prepreg of a non-woven material containing a multi-functional epoxy adhesive, in an expanded PTFE matrix may also be used. Speedboard® N has a dielectric constant, (Dk) of is 3.0 at 1 MHz, a loss tangent of 0.02 at 1 MHz, a dielectric strength greater than 900 V/mil, a glass transition and a $T_g$ of 140° C., a resin content of 66–68 wt. % and is available in a variety of thicknesses. Another dielectric is an expanded PTFE matrix, shown in FIG. 7, that includes a mixture of at least two of a cyanate ester compound, an epoxy compound, a bis-triazine compound and a poly (bis-maleimide) resin. For example, a varnish solution is made by mixing 5.95 pounds of M-30 (Ciba Geigy), 4.07 pounds of RSL 1462 (Shell Resins, Inc.), 4.57 pounds of 2,4,6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths—20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web any be any desired thickness, such as 25 $\mu$m, 40 $\mu$m or thickener. A 25 $\mu$m thick material has a mass of approximately 0.9 g and a weight per area of approximately 11.2 to 13.8 g/m$^2$.

Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 to Gore and 4,482,516 to Bowman, et al., each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer. Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, microporous cellulose acetate, can also be used. The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Partial Analyzer device, which displays a maximum particle size, a minimum particle size and an average particle size by way of a histogram. Suitable fillers to be incorporated into the adhesive $BaTiO_2$, $SiO_2$, $Al_2O_3$, ZnO, $ZrO_2$, $TiO_2$, precipitated and sol-gel silicas, non-conductive carbon (carbon black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by using coupling agents. Suitable coupling agents include, silanes, titanates, zirconates, and aluminates. Suitable sylating agents may include, but are not limited to, functional silyating agents, silizanes, disilazanes, siloxanes. Suitable silazanes includes hexamethyidisilazane (Huls H730) and hexamethylcyclotrisilazane, silylamides such as bis (trimethylsilyl)acetamide (Huls B2500), silylureas such as trimethylsilylurea, and silylmidazoles as such as trimethyl-silylimidazole. Titanates coupling agents are exemplified by the tetra alkyl type, coordinate type, chelate type, quaternary salt type, Tyzor® TOT {tetrakis(2-ethyl-hexyl)titanate}, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl (diallyl)oxy, tri(dioctyl)pyro-phosphato titanate. Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, tri(dodecyl)benzene-sulfonyl zirconate. The aluminates that can be used in the present invention include, but are not limited to Kenrich®, diisobutyl(oleyl)acetoacetyl aluminate (KA301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polydiborane, acetylene-terminated polyimide, polybutadiene, cyclic olefinic poly-cyclobutene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof. It should be understood that the aforementioned adhesives may themselves be blended together or blended with other polymers or additives, so as to impact flame retardancy or enhanced toughness.

As used herein Mean Flow Pore Size and minimum pore size were determined using the Coulter® Porometer II (Coulter Electronics Ltd., Luton UK) which reports the value directly. Average particle size and largest particle size were determined using a Microtrac light scattering particle size analyzer Model No. FRA (Microtrac Division of Leeds & Northup, North Wales, Pa., USA). The average particle size (APS) is defined as the value at which 50% of the particles are larger than. The largest particle size (LPS) is defined as the largest detectable particle on a Microtrac histogram Alternatively, the largest particle size is defined at the minimum point when the Microtrak FRA determines that 100% of the particles have passed.

0.8 or the minimum pore size to the maximum particle size is at least above 0.4. The MFPS to particle size ratio ratios being performed with a microtrak FRA analyzer. Alternatively, another mechanism for gauging relative pore and particle sizes may be calculated as the smallest pore size being not less than about 1.4 times the largest particle size. Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

|  | Substrate Pore Size | | Particle Size | | MFPS | $Pore_{min}$ | $Pore_{Min}$ | |
| --- | --- | --- | --- | --- | --- | --- | --- | --- |
|  | Min ($\mu$m) | MFPS ($\mu$m) | Avg ($\mu$m) | Max ($\mu$m) | ÷ $Part_{Avg}$ | ÷ $Part_{Max}$ | ÷ $Part_{Avg}$ | Result |
| Sample A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

In general, the method for preparing the adhesive-filler dielectric involves: (a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

To prepare the filled adhesive material of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate. If the substrate is to be expanded polytetrafluoroethylene, then structures similar to those taught in U.S. Pat. No. 4,482,516 to Bowman, et al. are desirable. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above One example of the ceramic adhesive-filler dielectric composites is the following. A fine dispersion was prepared by mixing 281.6 g $TiO_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible, partially cured composite. The partially-cured adhesive composite thus produced comprised of 57 weight percent $TiO_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 $\mu$m (0.0039"(3.9 mil)) dielectric laminate thickness.

A second example of the ceramic adhesive-filler dielectric composites is the following. A fine dispersion was prepared by mixing 386 g $SiO_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible, partially cured composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

A third example of the ceramic adhesive-filler dielectric composites is the following. A fine dispersion was prepared by mixing 483 g $SiO_2$(HW-11-89, Harbison Walker Corp.) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible, partially cured composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

A fourth example of the ceramic adhesive-filler dielectric composites is the following. A fine dispersion was prepared by mixing 15.44 kg $TiO_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible, partially cured composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008. A particularly preferred adhesive filler dielectric relies upon the use of a spherically shaped $SiO_2$ filler that is prepared by vapor metal combustion and available from Tatsumori LTD.

A fifth example of the ceramic adhesive-filler dielectric composites is the following. A fine dispersion was prepared by mixing 7.35 kg $SiO_2$ (ADMATECHS SO-E2, Tatsumori LTD) with 7.35 kg MEK and 73.5 g of coupling agent, i.e.,3-glycidyloxypropyltri-methoxysilane (Dynasylan GLYMO (Petrach Systems). To this dispersion was added 932 g of a 50% (w/w) solution of a cyanated phenolic resin, Primaset PT-30 (Lonza Corp.). In MEK, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w). The fine dispersion was poured into an impregnation bath. An expanded polytetrafluoroethylene web having the node fibril structure of FIG. 8, and the following properties was impregnated:

| Frazier | 20.55 $cf^3$/min/$ft^2$ |
|---|---|
| Surface Area | 9.0 g/$m^2$ |
| Ball Burst | 3.2 lbs |
| Thickness | 6.5 mil |
| Mean Flow Pore Size | 9.0 microns |

The Frazier number relates to the air permeability of the material being assayed. Air permeability was measured by clamping the web in a gasketed fixture which was provided with a circular area of approximately 6 square inches for air flow measurement. The upstream side was connected to a flow meter in line with a source of dry compressed air. The downstream side of the sample fixture was open to the atmosphere. Testing was accomplished by applying a pressure of 0.5 inches of water to the upstream side of the sample and recording the flow rate of the air passing through the in-line flowmeter (a ball-float rotameter that was connected to a flow meter. The Ball Burst Strength is a test that measures the relative strength of samples by determining the maximum at break. The web was challenged with a 1 inch diameter ball while being clamped between two plates. The Chatillon, Force gauge Ball/Burst Test was used. The media is placed taut in the measuring device and pressure affixed by raising the web into contact with the ball of the burst probe. Pressure at break is recorded. The ePTFE web was passed through a constantly agitated impregnation bath at a speed at or about 3 ft./min, so as to insure uniformity. The impregnated web was immediately passed through a heated oven to remove all or nearly all the solvent, and partially cure the adhesive and was collected on a roll. Several plies of this prepreg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.085 (10 GHz).

A sixth example of the ceramic adhesive-filler dielectric composites is the following. An ePTFE matrix containing an impregnated adhesive filler mixture, based on $SiO_2$ prepared from the vapor combustion of molten silicon was prepared from precursor solutions. Two precursor mixtures were initially prepared. Mixture I was in the form of a slurry containing a silanated silica similar to that of Example 5, where the silica contains a coating of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container. Mixture II comprises the desired resin blended in an MEK based solution containing an uncatalyzed resin blend (the adhesive) containing approximately 60% solids, where the solid portion is an exact mixture of 41.2% PT-30 cyanate ester resin, 39.5% RSL 1462 epoxy resin, 16.7% BC-58 flame retardant, 1.5% Irganox 1010, and 1% bisphenol A co-catalyst, all percentages by weight. Into a ten gallon container, 14.8 pounds of PT-30 and 15–20 pounds of MEK were added and stirred vigorously to completely solvate the PT-30. Then 6 pounds of BC-58 were measured and added to the MEK/PT-30 solution and vigorously agitated to solvate the BC-58. The stabilizer, 244.5 grams of Irganox 1010 and bisphenol A, 163 grams was added. The ten gallon container was reweighed and 14.22 pounds of RSL 1462 was added. Additional MEK was added to bring the solution weight to 60 pounds. The contents were then vigorously agitated for approximately 1 to 2 hours, or as long as necessary to completely dissolve the solid components. The desired product is a mixture of the silanated or titanated silica slurry, the uncatalyzed resin blend, and MEK in which 68% by weight of the solids are silica, and the total solids are between 5% and 50% by weight of the solution. The exact solids concentration varies from run to run, and depends in part on the membrane to be impregnated. The catalyst level is 10 ppm relative to the sum of the PT-30 and RSL 1462. The solid contents of mixtures I and II were determined to verify the accuracy of the precursors and compensate for any solvent flash that had occurred. Then mixture I was added to a ten gallon container to provide 12 pounds of solids, e.g., 51% solids content, 23.48 pounds of solution I. Then mixture II was added to the container to provide 5.64 pounds of solids, e.g., 59.6% solids (9.46 pounds of mixture II). The manganese catalyst solution (0.6% in mineral spirits), 3.45 grams, was added to mixture I and mixture II and blended thoroughly to form a high solids content solution. The bath solution for impregnating an ePTFE matrix, 28% solids solution, was prepared by adding sufficient MEK to the high solids content solution to a total weight of 63 pounds. Thereafter, an ePTFE matrix was impregnated with this bath solution to form a dielectric material.

A seventh example of the ceramic adhesive-filler dielectric composites is the following. A fine dispersion was prepared by mixing 26.8 g Furnace Black (SpecialSchwarz 100, Degussa Corp, Ridgefield Park, N.J.) and 79.8 g of coupling agent (GLYMO CAS #2530-83-8); 3-Glycidyloxypropyltrimethoxysilane. The dispersion was subjected to ultrasonic agitation for 1 minute, then 17.5 pounds of $SiO_2$ (SO-E2) in 17.5 pounds of MEK were added. The dispersion was heated with constant overhead mixing for 1 hour at reflux, then allowed to cool to room temperature. Separately, an adhesive varnish was prepared by adding the following: 3413 g of a 57.5% (w/w) solution of Primaset PT-30 in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A in MEK, 71.5 g Irganox 1010, 3.21 g of a 0.6% (wlw) solution of Mn HEX-CEM in mineral spirits, and 2.40 kg MEK. In a separate container, 3739 g of the dispersion described above was added, along with 0.0233 g of Furnace Black (SpecialSchwarz 100), 1328 g of the adhesive varnish described above and 38.3 lbs MEK. This mixture was poured into an impregnation bath, and an e-PTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll. Several plies of this prepreg were laid up between copper foil and pressed at 200 psi in a vacuum-assisted hydraulic press at temperature of 220° C. for 90 minutes then cooled under pressure. This resulting dielectric displayed good adhesion to copper.

An eighth example of the ceramic adhesive-filler dielectric composites is the following. An adhesive varnish was prepared by adding the following: 3413 g of a 57.5% (w/w) solution of Primaset PT-30 (PMN P-88-1591) in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A in MEK, 71.5 g Irganox 1010, 3.21 g of a 0.6% (w/w) solution of Mn HEX-CEM in mineral spirits, and 2.40 kg MEK. In a separate container, 1328 g of the adhesive varnish described above, 42.3 lbs MEK, 6.40 g of Furnace Black (SpecialSchwarz 100), and 1860 g $SiO_2$ (SO-E2) were added. This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll. Several piles of this prepreg were laid up between copper foil and pressed at 200 psi in a vacuum-assisted hydraulic press at temperature of 220° C. for 90 minutes then cooled under pressure. This resulting dielectric displayed good adhesion to copper.

Referring back to the steps of producing the chip package, the adhesive is then placed within the openings of the alignment frame atop the substrates. Subsequently, the stiffener is placed within the openings of the alignment frame atop the adhesive. The adhesive serves to bond substrates to stiffener. The preforming of the adhesive to the correct dimensions may be accomplished by any suitable means such as lasering or mechanically punching. Suitable adhesives include Ablestik 564A conductive adhesive (manufactured by Ablestik Co. of Rancho Dominguez, Calif.) and should be sized such that the resultant flow of adhesive resin will not penetrate into cavity openings in the stiffener or spreader. In one embodiment, the difference in size must be at least 0.020" per side of a cavity opening.

Suitable stiffeners include solid metal (typically copper) material or laminated structures, with or without cavities, used to enhance the flexural modulus, or rigidity of the substrate or substrate package. In one embodiment, a metal or laminate whose coefficient of thermal expansion is equal to or less than that of the substrate or substrate package to maximize flatness of the finished product is selected. Stiffeners referred herein also include heat spreaders which are typically solid metal (typically copper) material, with or without cavities, used to efficiently conduct heat from the substrate or substrate package as well as enhance the flexural modulus, or rigidity of the substrate or substrate packrate or substrate package using an electrically or thermally conductive adhesive. The substrate, adhesive and stiffener form a chip package.

A sheet of an interface material such as skived PTFE is placed atop the stiffener. In one embodiment, the top half of the vacuum frame is the lowered onto the bottom half and secured in place with a latch. The top half of the frame is hinged to the bottom and includes two vacuum ports. The bottom half of the frame contains one sealed thermocouple connection.

In one embodiment, the frame is then placed in a reusable vacuum bag such as one made by Zip-Vac of Auburn, Wash. A reusable vacuum frame, which is also referred to as a "vacuum bag," is typically made of silicone rubber attached to aluminum. Vacuum is then applied to the frame. The amount of vacuum being applied is determined by the type of adhesive being used. Ablestik conductive adhesives require a minimum of about 6" Hg (3 psi).

After reaching the desired vacuum, the vacuum frame is then placed in a oven and baked for a predetermined period of time based on the adhesive being used. Ablestik conductive adhesives require a minimum cure time of about 1 hour at or above about 150° C. Gore "paste" adhesive requires a minimum cure time of about 1 hour at or above about 190° C.

Any alternative method of applying pressure and heat to cure the adhesive and thus, bond the stiffener to the substrate may be employed. Such alternative methods include placing in an oven while applying pressure, for example, from a weight or press.

When the oven cure cycle is complete, the vacuum bag is removed from the oven and allowed to cool under vacuum until it can be easily handled, typically ½ hour. The vacuum is then shut off to the frame. The frame is opened and the skived PTFE atop the components is discarded. The alignment frame is untaped from the vacuum frame and removed. Finally, the bonded packages are removed from the alignment frame openings.

Subsequently, coined solder balls are produced by the method described above.

A specific example of the solder coining process is as follows:

The ram having the silicone rubber face is pressed onto a slug or metal interface which is on the solder balls of the chip package. The amount of time that pressure is applied is determined by the type of solder employed and the amount of pressure applied is dependent on the area of the part to be coined. In this example, the amount of time that pressure from the press is applied to the package is between about 10–30 seconds.

| | |
|---|---|
| Ram Cylinder dia. | 2.97 |
| Ram Area | 6.9 sq. inches |
| Line Pressure | 60–70 psi |
| Force | 8–10 lbs |
| Force/Contact Area | 350–450 psi |

It should be noted that these ranges are approximate and are given as an example only. The present invention is not limited to just those ranges set forth above. Other ranges of force and pressure can be used depending on the size, etc. of the chip package, and solder composition.

The result of the present invention is coined solder balls which are solder balls flattened with the same planarity. The coined solder balls made by the method and apparatus of the present invention have an approximate average flatness of better than 21 microns across 12 mm (0.0008 inches) with a standard deviation of approximately better than 7 microns (0.00027 inches).

While particular embodiments of the present invention have been illustrated and described herein, the present invention is not limited to such illustrations and descriptions. It should be apparent that changes and modifications may be incorporated and embodied as part of the present invention within the scope of the following claims.

Having described the invention, what is claimed is:

1. A method for coining solder balls of an organic chip package, said method comprising the steps of:

a) providing a chip package having a plurality of solder balls on a first surface thereof;

b) placing a slug on one or more of the solder balls; and c) applying sufficient pressure for a sufficient period of time to the slug to flatten the surface of the solder balls so as to form planar solder coins, wherein said planar solder coins have an average flatness on a surface thereof of less than about 21 microns across about 12 millimeters.

2. The method according to claim 1 further comprising the steps, prior to step a), of:

d) placing a substrate within an alignment frame;

e) applying an adhesive on the substrate within the alignment frame;

f) placing a stiffener on the adhesive within the alignment frame; and g) applying sufficient pressure and heat based on the type of adhesive and geometry of the chip package for a sufficient time so as to cure the adhesive.

3. The method according to claim 1, wherein the period of time applied in said step c) is about 10–30 seconds at a pressure of about 350 to 450 psi on the slug.

4. The method according to claim 1, wherein the chip package is a flip chip package.

5. The method according to claim 1, wherein the pressure is applied by a ram.

6. A method according to claim 5, wherein the ram has a silicone elastomer face.

7. A method according to claim 6, wherein the solder coining press is a pneumatic press.

8. A method according to claim 7, wherein the ram is attached to the press using a ball and socket joint for self-planarizing.

* * * * *